United States Patent
Koga et al.

(10) Patent No.: US 8,305,555 B2
(45) Date of Patent: Nov. 6, 2012

(54) EXPOSURE APPARATUS, EXPOSURE METHOD, AND DEVICE MANUFACTURING METHOD

(75) Inventors: Shinichiro Koga, Utsunomiya (JP); Noburu Takakura, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 286 days.

(21) Appl. No.: 12/756,517

(22) Filed: Apr. 8, 2010

(65) Prior Publication Data
US 2010/0259741 A1    Oct. 14, 2010

(30) Foreign Application Priority Data

Apr. 14, 2009   (JP) ................................ 2009-098487

(51) Int. Cl.
*G03B 27/42* (2006.01)
*G03B 27/54* (2006.01)
(52) U.S. Cl. ........................................... 355/53; 355/67
(58) Field of Classification Search .................... 355/52, 355/53, 55, 67
See application file for complete search history.

(56) References Cited

U.S. PATENT DOCUMENTS

| | | | |
|---|---|---|---|
| 6,219,130 B1* | 4/2001 | Kawakubo | 355/67 |
| 6,538,260 B1 | 3/2003 | Koga | |
| 6,963,389 B2* | 11/2005 | Fukada | 355/53 |
| 7,477,390 B2* | 1/2009 | Koga | 356/401 |
| 7,672,000 B2* | 3/2010 | Hayashi | 356/614 |

FOREIGN PATENT DOCUMENTS

JP    2000-275010 A    10/2000

* cited by examiner

*Primary Examiner* — Hung Henry Nguyen
(74) *Attorney, Agent, or Firm* — Rossi, Kimms & McDowell LLP (57) ABSTRACT

An exposure apparatus sequentially transfers a pattern of an original to a plurality of shot regions on a substrate, wherein each shot region includes a chip region and a scribe line region surrounding the chip region. The apparatus includes a detector configured to detect light beams from a first mark and a second mark arranged in a first scribe line region and a second scribe line region, respectively, adjacent to each other on the substrate driven in a measurement scanning direction by substantially simultaneously observing the first scribe line region and the second scribe line region, and a processor configured to process detection signals output from the detector to determine positions of the first mark and the second mark, wherein the substrate is positioned based on the positions of the first mark and the second mark and is exposed.

10 Claims, 9 Drawing Sheets

EXPOSURE APPARATUS, EXPOSURE METHOD, AND DEVICE MANUFACTURING METHOD

BACKGROUND OF THE INVENTION

1. Field of the Invention

The present invention relates to an exposure apparatus and exposure method which sequentially transfer the pattern of an original to a plurality of shot regions on a substrate, and a device manufacturing method.

2. Description of the Related Art

Devices such as a semiconductor device can be manufactured through a photolithography process. The photolithography process includes an exposure process of transferring the pattern of an original (also called a mask or a reticle) onto a substrate (e.g., a wafer) coated with a photosensitive material, and a process of developing the substrate. In the exposure process, an exposure apparatus sequentially transfers the pattern of an original to a plurality of shot regions on a substrate. The positions of marks on the substrate are detected to align the pattern of the original and each shot region on the substrate. The positions of the marks on the substrate can generally be detected while the substrate stands still.

SUMMARY OF THE INVENTION

The present invention reduces the time taken to transfer a pattern onto a substrate by detecting positions of marks on the substrate within a shorter period of time.

One of aspects of the present invention provides an exposure apparatus which sequentially transfers a pattern of an original to a plurality of shot regions on a substrate, each shot region including a chip region and a scribe line region surrounding the chip region, the exposure apparatus comprising a detector configured to detect light beams from a first mark and a second mark arranged in a first scribe line region and a second scribe line region, respectively, adjacent to each other on the substrate driven in a measurement scanning direction by substantially simultaneously observing the first scribe line region and the second scribe line region, and a processor configured to process detection signals output from the detector to determine positions of the first mark and the second mark, wherein the substrate is positioned based on the positions of the first mark and the second mark and is exposed.

Further features of the present invention will become apparent from the following description of exemplary embodiments with reference to the attached drawings.

DESCRIPTION OF THE EMBODIMENTS

First Embodiment

Figure 2:
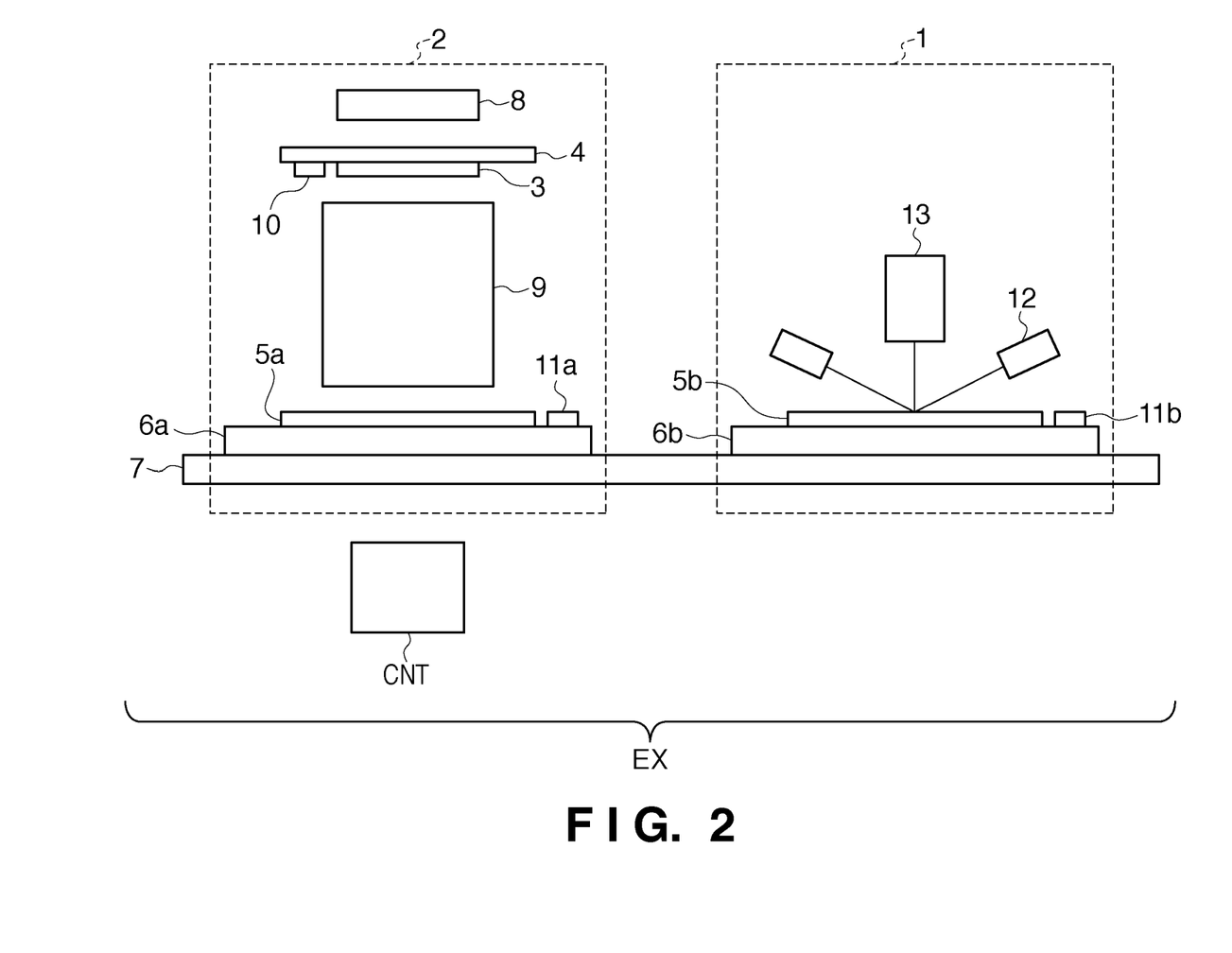
FIG. 2 is a view illustrating the arrangement of an exposure apparatus according to one embodiment of the present invention.

An exposure apparatus EX according to one embodiment of the present invention will be described with reference to FIG. 2. In this embodiment, the exposure apparatus EX includes a measurement station 1 and exposure station 2. In the exposure station 2, the pattern of a reticle (original) is sequentially transferred to a plurality of shot regions on a substrate. The exposure station 2 includes a reticle stage 4 which holds a reticle 3, two wafer stages 6, that is, 6a and 6b which hold wafers (substrate) 5, that is, 5a and 5b and can move between the measurement station 1 and the exposure station 2, and a top plate 7 which supports the wafer stages 6. The exposure station 2 also includes an illumination optical system 8 which illuminates the reticle 3 held by the reticle stage 4 with exposure light, and a projection optical system 9 which projects and transfers the pattern of the reticle 3 onto the wafer 5a held by the wafer stage 6. The number of wafer stages 6 may be one or three or more. A controller CNT controls the operation of the exposure apparatus EX.

The following description assumes that the exposure apparatus EX is a scanner which transfers the pattern of the reticle 3 onto the wafer 5 while synchronously moving the reticle 3 and wafer 5 in the scanning direction. However, this is to give a concrete example, and the exposure apparatus may be, for example, a stepper. In the following description, a direction parallel to the optical axis of the projection optical system 9 is defined as the Z-axis direction, the direction (scanning direction) to synchronously move the reticle 3 and wafer 5 within a plane perpendicular to the Z-axis direction is defined as the Y-axis direction, and a direction (non-scanning direction) perpendicular to both the Z- and Y-axis directions is defined as the X-axis direction. Also, the rotation directions about the X-, Y-, and Z-axes are defined as the θX, θY, and θZ directions, respectively.

The illumination region on the reticle 3 is illuminated with exposure light having a uniform illuminance distribution by the illumination optical system 8. A light source which emits exposure light can be, for example, a mercury lamp, a KrF excimer laser, an ArF excimer laser, an $F_2$ laser, or an EUV (Extreme Ultra Violet) light source.

The reticle stage 4 can, for example, two-dimensionally move within a plane perpendicular to the optical axis of the projection optical system 9, that is, within the X-Y plane, and finely rotate in the θZ direction. A reticle stage driving mechanism (not shown) such as a linear motor drives the reticle stage 4. The controller CNT controls the reticle stage driving mechanism. A mirror is mounted on the reticle stage 4. A laser interferometer (not shown) is set at a position opposite to the mirror. The laser interferometer measures the rotation angle θZ and the position, in the two-dimensional direction within the X-Y plane, of the reticle 3 held by the reticle stage 4 in real time, and provides the measurement results to the controller CNT. The controller CNT controls the reticle stage driving mechanism based on the measurement results obtained by the laser interferometer, thereby positioning the reticle 3 held by the reticle stage 4.

The projection optical system 9 projects the pattern of the reticle 3 onto the wafer 5 at a projection magnification β. The projection optical system 9 includes a plurality of optical elements, which are supported by a lens barrel. The projection optical system 9 can have a projection magnification β of, for example, ¼ or ⅕.

Each wafer stage 6 includes, for example, a wafer chuck which holds the wafer 5. A wafer stage driving mechanism (not shown) such as a linear motor drives the wafer stage 6. The controller CNT controls the wafer stage driving mechanism. A mirror which moves together with the wafer stage 6 is mounted on the wafer stage 6. A laser interferometer (not shown) is set at a position opposite to the mirror. The laser interferometer measures the rotation angle θZ and the position, in the X and Y directions, of the wafer stage 6 in real time, and provides the measurement results to the controller CNT. The laser interferometer also measures the rotation angles θX and θY and the position, in the Z direction, of the wafer stage 6 in real time, and provides the measurement results to the controller CNT. The wafer stage 6 is driven by the wafer stage driving mechanism based on the measurement results obtained by the laser interferometer to adjust the position of the wafer 5 in the X, Y, and Z directions, thereby positioning the wafer 5 held by the wafer stage 6.

A reticle alignment direction system (not shown) is set near the reticle stage 4. The reticle alignment detection system detects stage reference marks 11, that is, 11a and 11b on the wafer stages 6 via the projection optical system 9 and a reticle reference mark 10 arranged on the reticle stage 4. The stage reference marks 11 are aligned with the reticle reference mark 10 using the reticle alignment detection system.

The measurement station 1 includes a focus detector 12 which detects the position information (the tilt information and the position information in the Z-axis direction) of the surface of the wafer 5. The measurement station 1 also includes a wafer alignment detector (to be simply referred to as an alignment detector hereinafter) 13 which detects the positions of the wafer 5 and stage reference mark 11. The focus detector 12 includes a light-projecting system which projects detection light onto the surface of the wafer 5, and includes a light-receiving system which receives the light reflected by the wafer 5. The detection result (measurement value) obtained by the focus detector 12 are provided to the controller CNT. The controller CNT adjusts the tilt angle and the position (focus position), in the Z-axis direction, of the wafer 5 based on the detection result obtained by the focus detector 12. The position detection results (measurement values) of the wafer 5 and stage reference mark 11 obtained by the alignment detector 13 are provided to the controller CNT as alignment position information within a coordinate system defined by the laser interferometer.

The stage reference mark 11 is set nearly flush with the surface of the wafer 5 and has its position detected by the reticle alignment detection system and the alignment detector 13. The stage reference mark 11 has a surface including a flat portion, which is used as the reference surface of the focus detector 12. Stage reference marks 11 may be arranged at a plurality of corners of the wafer stage 6. The wafer 5 includes a plurality of shot regions, and each shot region includes a chip region and a scribe line region surrounding it. Wafer alignment marks (to be also simply referred to as marks hereinafter) are arranged in the scribe line region. The marks and the chip region (or the shot region) have known positional relationships.

An exposure apparatus including two wafer stages can, for example, exchange a second wafer 5 on the wafer stage 6 in the measurement station 1 and perform a measurement process for the second wafer 5, while it performs an exposure process for a first wafer 5 on the wafer stage 6 in the exposure station 2. After the respective operations are completed, the wafer stage 6 in the exposure station 2 moves to the measurement station 1, while the wafer stage 6 in the measurement station 1 moves to the exposure station 2 and an exposure process is performed for the second wafer 5 in parallel.

An exposure method for the exposure apparatus EX will be explained next. After a wafer 5 is loaded into the measurement station 1, the stage reference mark 11 is detected by the alignment detector 13. To do this, the controller CNT moves the wafer stage 6 while monitoring the output from the laser interferometer so that the optical axis of the alignment detector 13 runs through the stage reference mark 11. With this operation, the alignment detector 13 measures the position information of the stage reference mark 11 within a coordinate system defined by the laser interferometer. Also, the focus detector 12 detects the surface position information of the stage reference mark 11 in the measurement station 1.

The position of each shot region on the wafer 5 is detected next. More specifically, the controller CNT moves the wafer stage 6 while monitoring the output from the laser interferometer so that the alignment detector 13 simultaneously observes two adjacent scribe regions (a first scribe line region and a second scribe line region). In the process of the movement, the alignment detector 13 detects the positions of the wafer alignment marks arranged in the two adjacent scribe regions (the first scribe line region and the second scribe line region) on the wafer 5. The two adjacent scribe line regions mean herein two scribe line regions adjacent to each other at the boundary between adjacent chip regions. The position of each mark within a coordinate system defined by the laser interferometer is detected by repeating the foregoing operation until all measurement target marks have been measured. Details of wafer alignment measurement will be described later. The positional relationship between the stage reference mark 11 and each wafer alignment mark is obtained based on the detection results of the stage reference mark 11 and each wafer alignment mark obtained by the alignment detector 13. Since the positional relationship between each wafer alignment mark and each shot region is known, that between the stage reference mark 11 and each shot region on the wafer 5 within the X-Y plane, in turn, is determined.

The focus detector 12 detects the pieces of surface position information of the wafer 5 in all shot regions on the wafer 5. The detection results are stored in the controller CNT in correspondence with the position in the X and Y directions within a coordinate system defined by the laser interferometer. The positional relationship between the surface of the stage reference mark 11 and the surface of the wafer 5 in each shot region on it is determined based on the detection results of the surface position information of the stage reference mark 11 and the surface position information of the wafer 5 in each shot region on it, which are obtained by the focus detector 12.

The wafer 5 is exposed in the exposure station 2 using the results of the measurement process for the wafer 5 in the measurement station 1. The controller CNT moves the wafer stage 6 so as to detect the stage reference mark 11 using the reticle alignment detection system.

The reticle alignment detection system detects the stage reference mark 11 via the reticle reference mark 10 and projection optical system 9. That is, the positional relationships between the reticle reference mark 10 and the stage reference mark 11 in the X and Y directions and in the Z direction are detected via the projection optical system 9. This means that the position of a reticle pattern image formed on the wafer 5 by the projection optical system 9 is detected through the projection optical system 9.

The controller CNT moves the wafer stage 6 in order to sequentially expose a plurality of shot regions on the wafer 5. The controller CNT controls the exposure station 2 and wafer stage 6 so as to scan-expose each shot region on the wafer 5 using the measurement results obtained in the measurement station 1. During the exposure, the reticle 3 and each shot region on the wafer 5 is aligned based on the positional relationship between the stage reference mark 11 and each shot region obtained in the measurement station 1, and that between the stage reference mark 11 and the reticle pattern image obtained in the exposure station 2.

Also, during the scanning exposure, the positional relationship between the surface of the wafer 5 and the plane onto which a reticle pattern image is projected by the projection optical system 9 is adjusted. This adjustment is performed based on the positional relationship between the surface of the stage reference mark 11 and the surface of the wafer 5 obtained in the measurement station 1, and that between the surface of the stage reference mark 11 and the plane on which a reticle pattern image is formed by the projection optical system 9 obtained in the exposure station 2.

Wafer alignment measurement will be explained in detail next. In this embodiment, the alignment detector (detector) 13 substantially simultaneously observes two adjacent scribe line regions on a wafer (substrate) while the wafer is driven in a scanning direction for measurement. The alignment detector 13 detects light beams from the marks respectively arranged in the two adjacent scribe line regions, and provides the detection signals to the controller (processor) CNT. The controller CNT includes a processor which processes the detection signal provided from the alignment detector 13 to determine the mark position. In this manner, in this embodiment, light from a mark on a wafer is detected while the wafer moves, and the position of the mark is detected based on the detection signal of the mark (this is called a scanning measurement method). According to the scanning measurement method, it is possible to shorten the time taken to detect the mark position as compared with an apparatus which detects the mark position while the wafer stands still.

Figure 1:
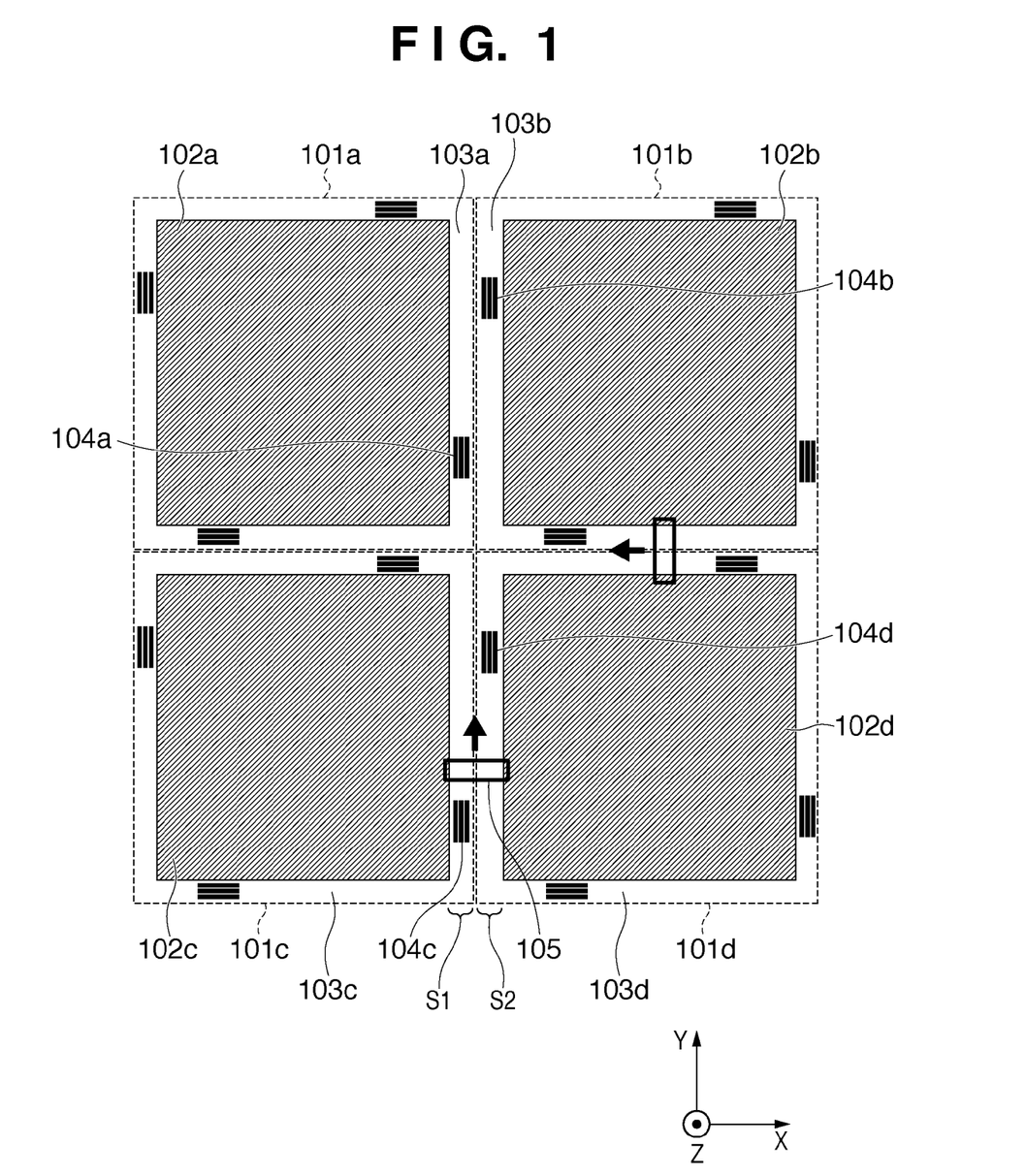
FIG. 1 is a partial enlarged view of FIG. 12.
Figure 3:
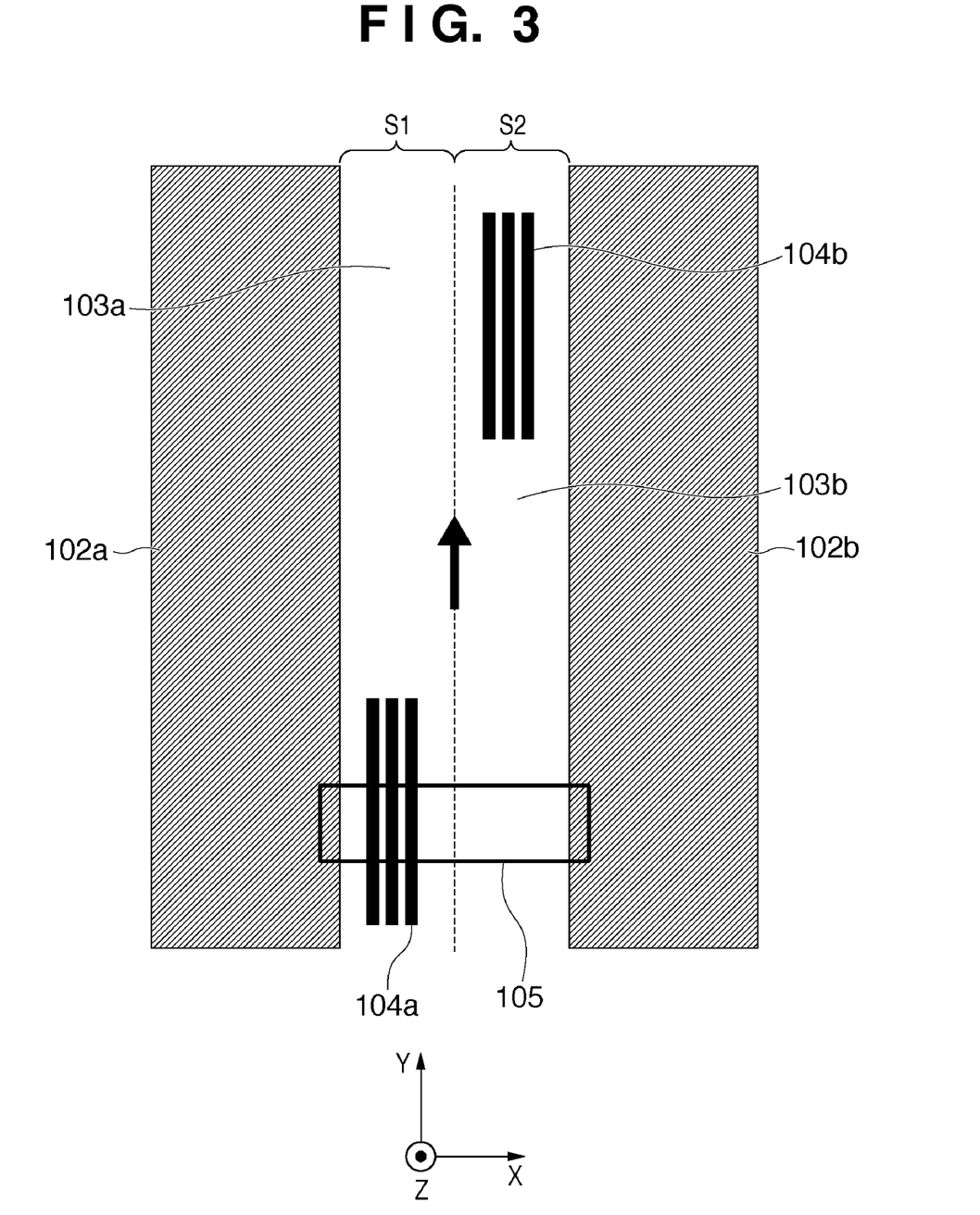
FIG. 3 is a partial enlarged view of FIG. 1.
Figure 12:
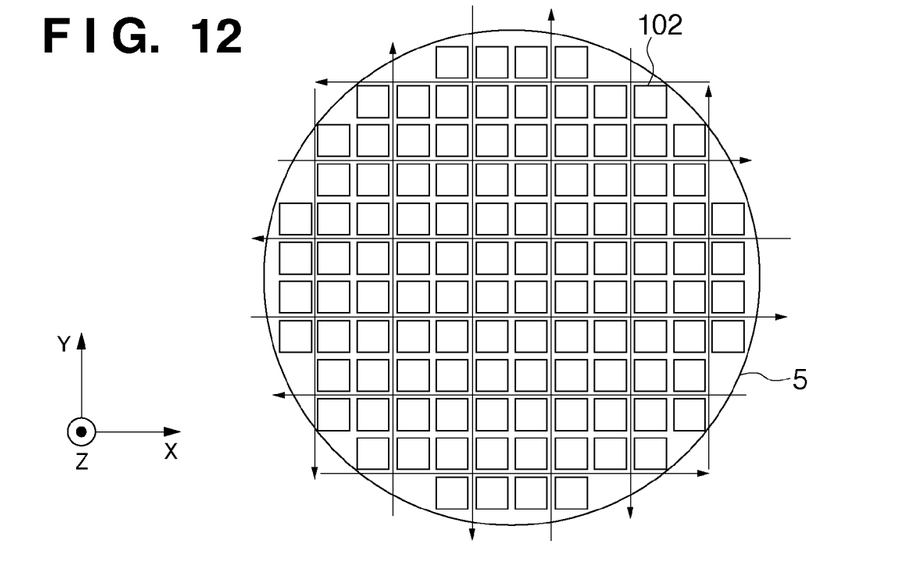
FIG. 12 is a view illustrating the scanning path in scanning measurement.

FIG. 12 illustrates scanning in the scanning measurement method. The wafer 5 has an array of a plurality of shot regions on it. FIG. 1 is a partial enlarged view of FIG. 12. FIG. 3 is a partial enlarged view of FIG. 1. FIG. 1 illustrates the arrangement of shot regions 101, that is, 101a to 101d. The respective shot regions 101 include chip regions 102, that is, 102a to 102d and scribe line regions 103, that is, 103a to 103d surrounding them. Wafer alignment marks 104 are arranged in the scribe line regions 103. Referring to FIGS. 12 and 1, each arrow indicates movement (and the scanning direction in the movement) of a field of view 105 of the alignment detector 13 relative to the wafer 5. In practice, the field of view 105 is fixed and the wafer 5 moves in the direction opposite to that indicated by each arrow together with the wafer stage 6. The alignment detector (detector) 13 substantially simultaneously observes a first scribe line region S1 (e.g., a scribe line region 103a or 103c) and a second scribe line region S2 (e.g., a scribe line region 103b or 103d) which are adjacent to each other on the wafer 5 while the wafer 5 is driven in the measurement scanning direction. The alignment detector 13 detects light beams from a first mark 104a or 104c and a second mark 104b or 104d which are arranged in the first and second first scribe line regions S1 and S2, respectively, and provides the detection signals of these marks to the controller (processor) CNT. The position of the entire surface of the wafer 5 (those in all shot regions) can be detected by performing the above-mentioned scanning measurement in the sequence indicated by all arrows shown in FIG. 12.

Figure 13:
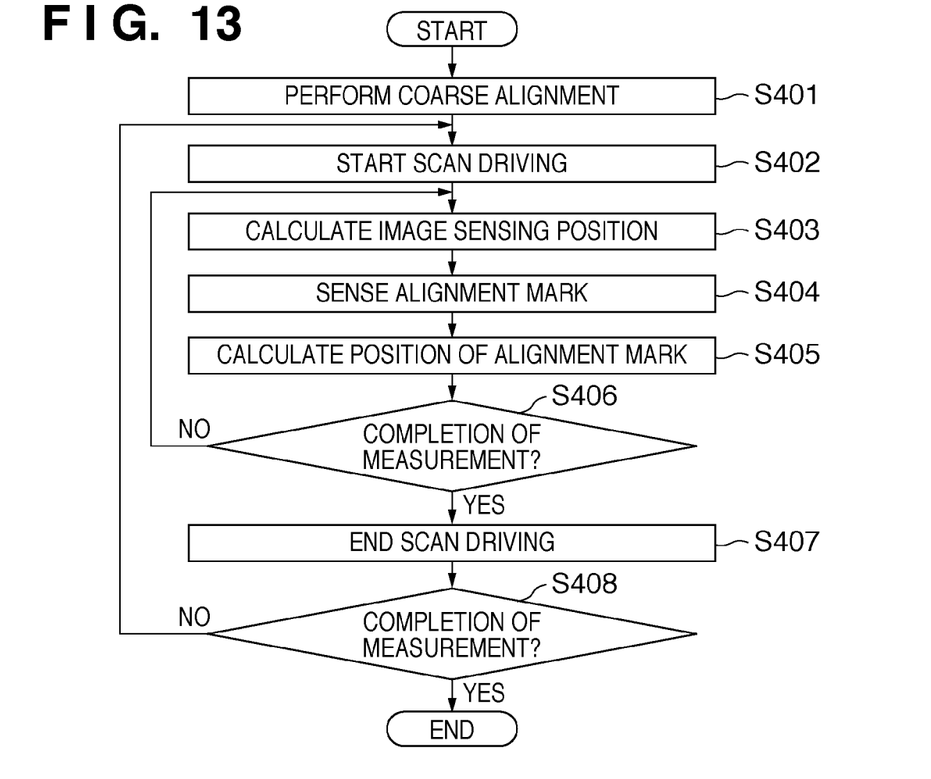
FIG. 13 is a flowchart illustrating the procedure of measurement by a scanning measurement method.

The procedure of measurement by a scanning measurement method will be exemplified with reference to FIG. 13. Step S401 is a coarse alignment process (coarse alignment measurement process) of measuring the coarse position of an array of shot regions. In the coarse alignment process, the positions of marks arranged in shot regions whose number (e.g., two) is smaller than those of shot regions that undergo the following alignment mark sensing process and alignment mark position calculation process are detected.

In steps S402 to S406, the positions of marks arranged in one pair of scribe line regions that are two adjacent scribe line regions are detected. In step S402, the wafer stage 6 is driven so that the field of view 105 of the alignment detector 13 relatively moves in the direction indicated by each arrow in FIG. 12. Note that the moving direction of the wafer stage 6 is opposite to that indicated by each arrow, as described above. FIG. 12 schematically shows the state in which marks are measured in the scanning measurement method. In step S403, the position (to be referred to as the stage position hereinafter) of the wafer stage 6, at which a sensor of the alignment detector 13 senses a mark, is calculated as an image sensing position. More specifically, the stage position at which a mark reaches the field of view 105 of the alignment detector 13 is calculated based on the position information of the array of shot regions measured in the coarse alignment process, and the design position of the mark in a preset certain shot region. In this embodiment, the alignment detector 13 is configured to perform bright-field illumination of a mark and sense, by the sensor, an image formed by the mark. The sensor can include an image sensor or a line sensor. In step S404, the mark is sensed by the sensor of the alignment detector 13 after the process waits until the wafer stage 6 reaches the image sensing position calculated in step S403. This image sensing is one example of a process of detecting light from a mark to generate a detection signal. This image sensing is performed while a mark moves into the field of view 105 of the alignment detector 13. The stage position during the image sensing is stored in the controller CNT. In step S405, the controller (processor) CNT accurately calculates, by a known method, the mark position in the field of view 105 of the alignment detector 13 based on the signal (detection signal) of the sensed mark image. The controller CNT calculates the mark position on the wafer based on the stage position during the mark sensing and the mark position in the field of view 105 of the alignment detector 13. The foregoing process is repeated until it is determined in step S406 that measurement of all marks arranged in the pair of scribe line regions of interest has been completed. If it is determined in step S406 that measurement of all marks arranged in the pair of scribe line regions of interest has been completed, the controller CNT ends the driving of the wafer stage 6 in step S407. Subsequently, the same measurement is performed for other pairs of scribe line regions until it is determined in step S408 that measurement of all pairs of scribe line regions has been completed.

Referring to FIG. 3, the driving direction (the measurement scanning direction) of the wafer stage 6 is the Y-axis direction as indicated by an arrow, and the positions of the marks 104a and 104b in the X-axis direction are detected. The field of view 105 of the alignment detector 13 has a width large enough to allow simultaneous observation of two adjacent scribe line regions (the first scribe line region S1 and the second scribe line region S2). In the example shown in FIG. 3, the positions of the marks 104a and 104b are different from each other in the scanning direction, so the image sensing timings of the marks 104a and 104b, in turn, are different from each other.

The alignment detector 13 can include a first unit which detects the position of a mark to detect the position in the X-axis direction, and a second unit which detects the position of a mark to detect the position in the Y-axis direction. The first unit can detect the position, in the X-axis direction, of a mark to detect the position in the X-axis direction while scanning the wafer in the Y-axis direction. Also, the second unit can detect the position, in the Y-axis direction, of a mark to detect the position in the Y-axis direction while scanning the wafer in the X-axis direction. The first unit and the second unit may be configured to share at least a part of an optical system which forms a mark image and/or an imaging sensor (an image sensor or a line sensor).

In this embodiment, a pattern which forms a mark to detect the mark position in the measurement direction extends parallel to the scanning direction (non-measurement direction) perpendicular to the measurement direction. Hence, an image formed on the image sensing surface of the imaging sensor does not change even when the mark moves in the scanning direction. The length of each pattern can be determined in accordance with, for example, the image sensing time and the scanning speed. Also, the number of patterns can be determined in accordance with, for example, the width of a scribe line region. In this embodiment, the scanning direction (non-measurement direction) is the Y-axis direction if the measurement direction is the X-axis direction. Also, the scanning direction (non-measurement direction) is the X-axis direction if the measurement direction is the Y-axis direction. The mark position in the measurement direction is detected (measured) herein.

Figure 4:
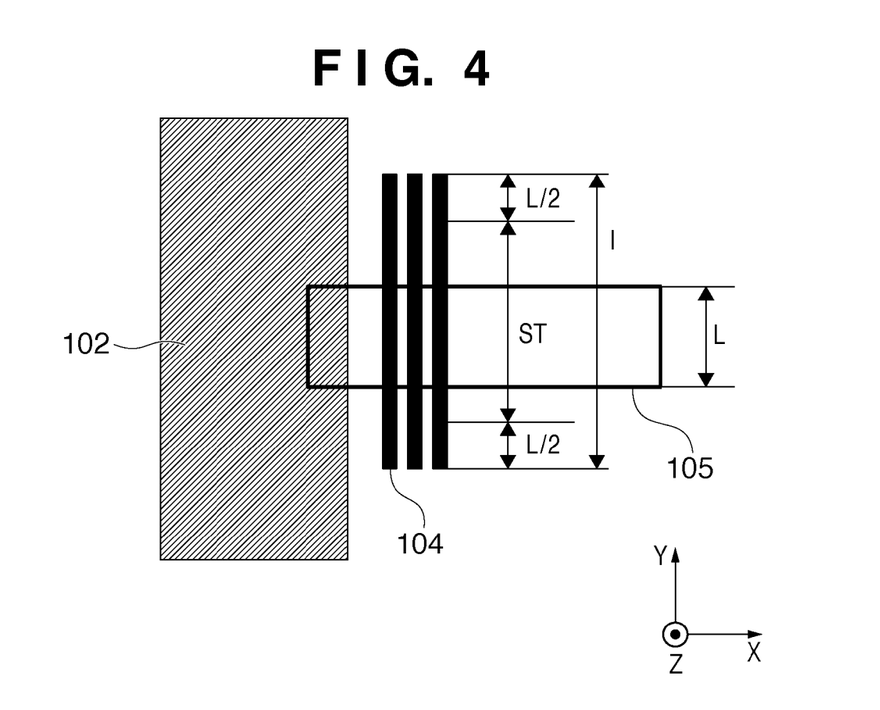
FIG. 4 is a view for explaining the size of an alignment mark.

Details of the foregoing description will be explained with reference to FIG. 4. A minimum value ML of a length l of a mark in the scanning direction (non-measurement direction) is given by:

$$ML = L + S \times T$$

where L is the length of the field of view 105 in the non-measurement direction, S is the speed of the wafer stage 6, and T is the mark sensing time.

Figure 5:
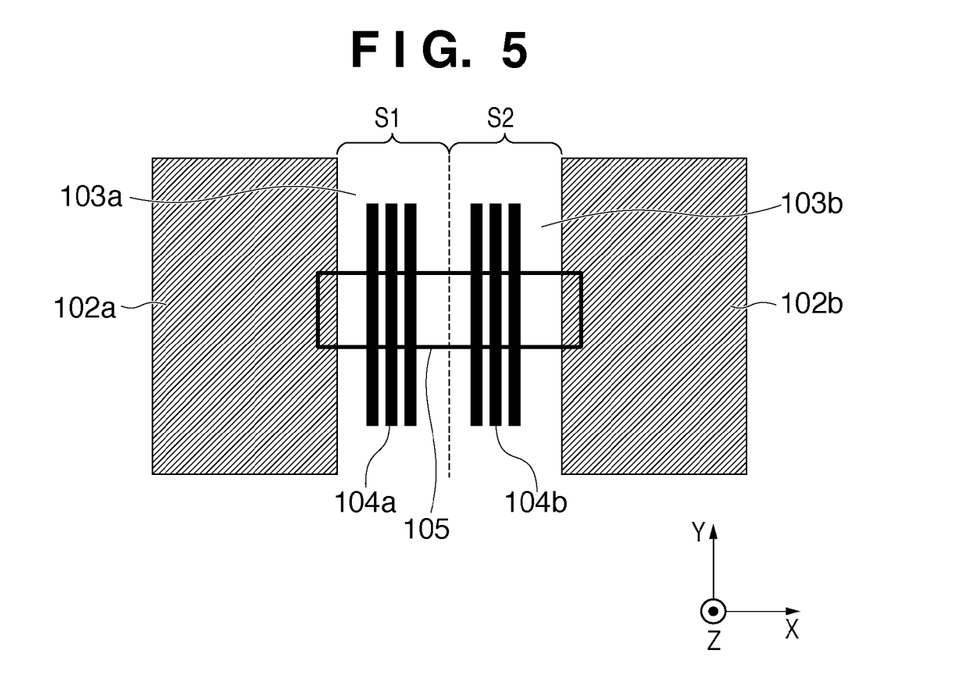
FIG. 5 is a view illustrating alignment marks.

FIG. 5 illustrates another example of the arrangement of the marks 104a and 104b. In the example shown in FIG. 5, the marks 104a and 104b have the same position in the scanning direction and therefore can be simultaneously sensed by the imaging sensor of the alignment detector 13. Image sensing can be performed a plurality of times, while the marks 104, that is, 104a and 104b illustrated in FIGS. 3 and 5 pass through the field of view 105, by elongating them in the scanning direction (non-measurement direction).

A method of detecting an error that may occur in synchronous processing between the wafer stage 6 and the alignment detector 13 will be explained below. As has been explained in relation to step S404 in FIG. 13, the alignment detector 13 performs a mark detection operation (image sensing operation) in synchronism with the position of the wafer stage 6. For this reason, if an error occurs in synchronous processing between the wafer stage 6 and the alignment detector 13, the controller (processor) CNT preferably detects the error. The controller CNT performs a mark detection process again upon detecting the occurrence of an error.

Figure 6:
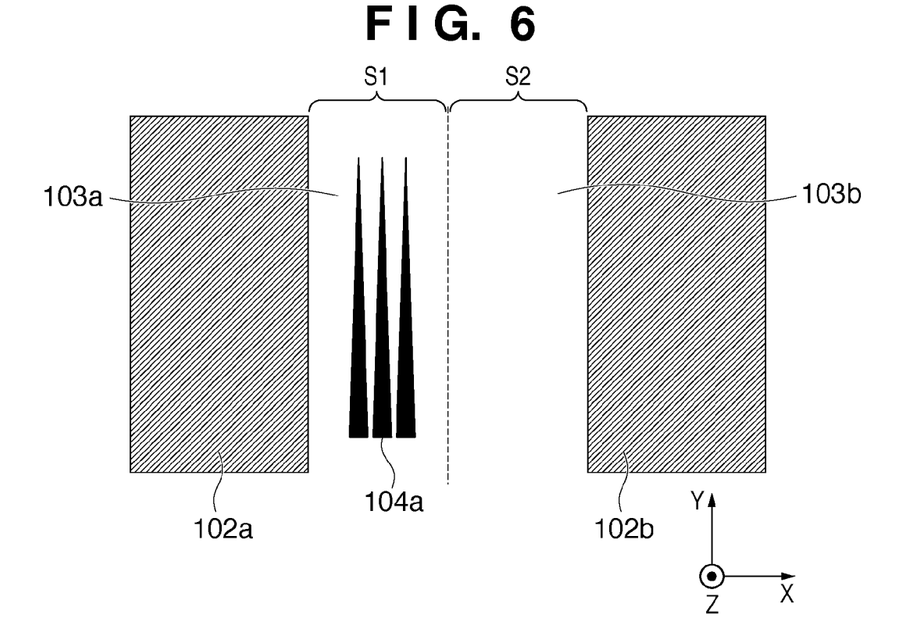
FIG. 6 is a view illustrating an alignment mark.
Figure 7:
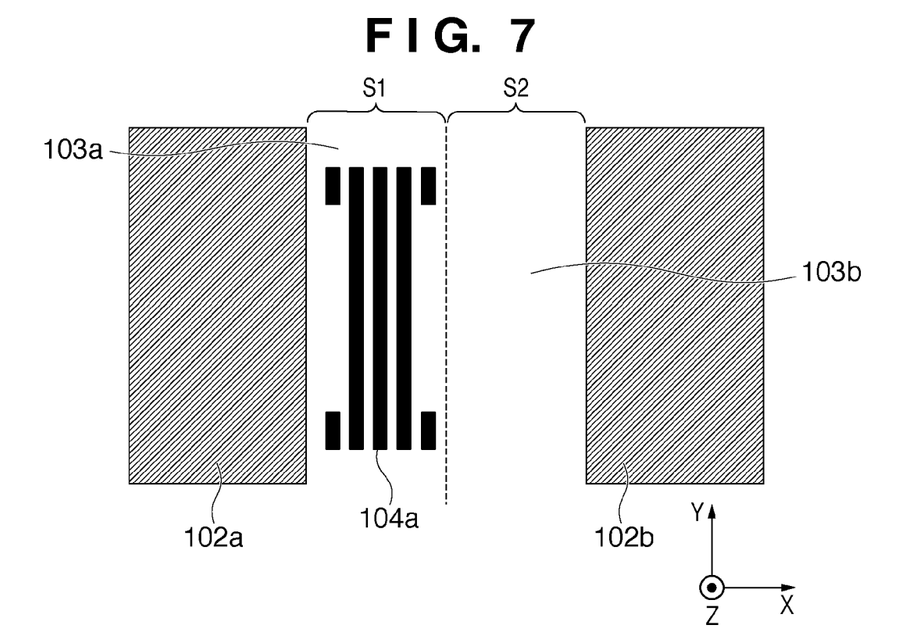
FIG. 7 is a view illustrating an alignment mark.

FIGS. 6 and 7 each illustrate the shape, of the detection signal output from the alignment detector 13, which changes in accordance with the position of the mark 104a in the scanning direction. Note that at least one of the first and second marks arranged in the first and second scribe line regions 103a and 103b, respectively, that are a pair of scribe line regions can have the shapes as illustrated in FIGS. 6 and 7. The controller CNT can confirm, whether synchronous processing is correctly performed, by processing the detection signal output from the alignment detector 13 and measuring the width of the mark pattern in the measurement direction. In the example shown in FIG. 6, the width of the mark pattern changes in accordance with the non-measurement direction. In the example shown in FIG. 7, a pattern to detect an error in synchronous processing is added to a pattern to detect the mark position in the measurement direction.

Second Embodiment

The second embodiment of the present invention will be described below. Details which are not particularly referred to in the second embodiment can be the same as in the first embodiment. In the second embodiment, an alignment detector 13 used includes a sensor which detects interference fringes formed by light beams reflected by marks (a first mark and a second mark) having undergone dark-field illumination. The sensor can include, for example, a light amount sensor such as a photodiode. A normal dark-field illumination detector scans a wafer by a very small amount and detects interference fringes formed by the light reflected by the wafer. In this embodiment, the sensor of the alignment detector 13 which detects interference fringes formed by light reflected by a wafer alignment mark detects the position of the wafer alignment mark while continuously scanning a distance across a plurality of shot regions, as illustrated in FIG. 12.

Figure 8:
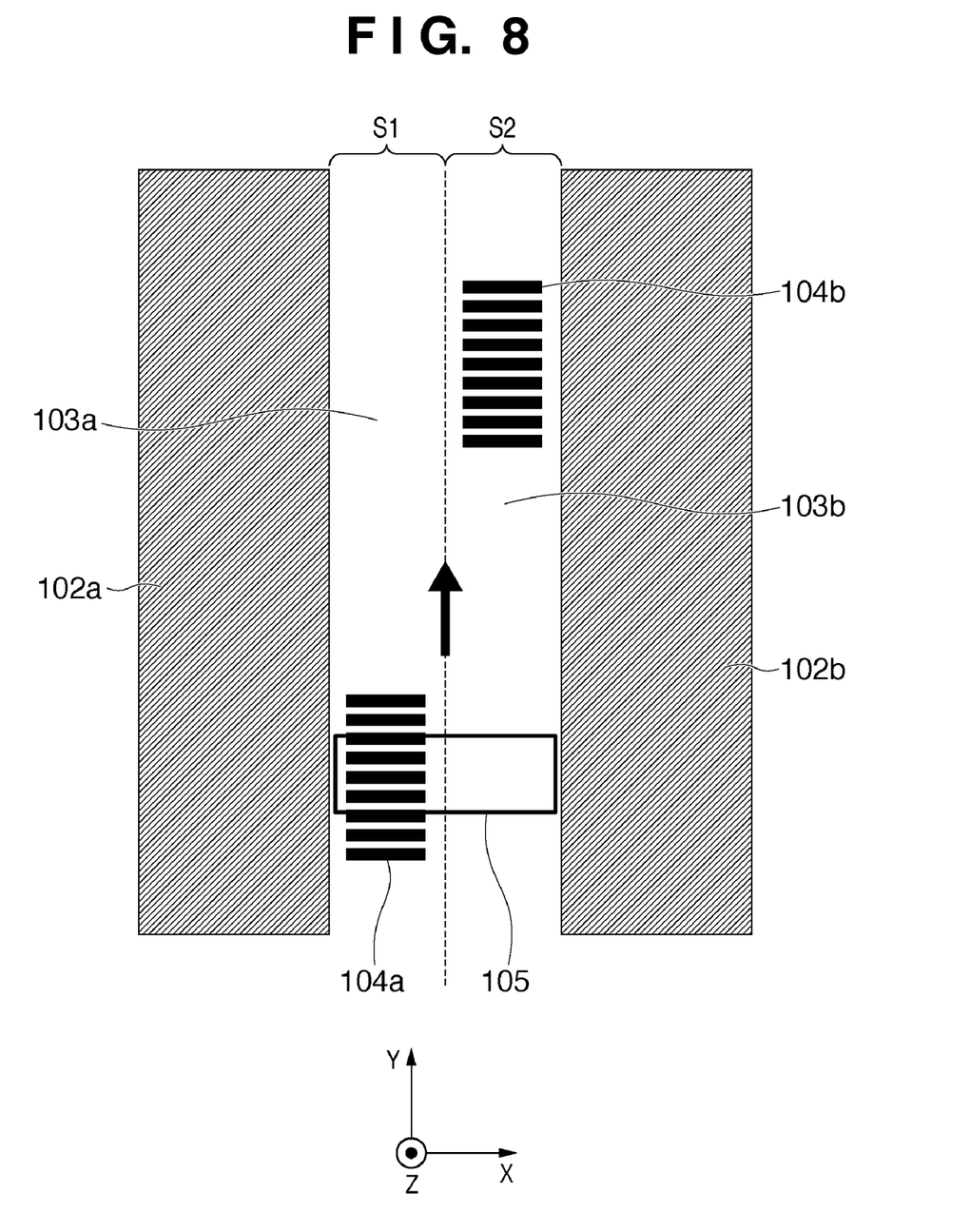
FIG. 8 is a view illustrating alignment marks.

FIG. 8 illustrates marks 104a and 104b suitable for an exposure apparatus according to the second embodiment. In the example shown in FIG. 8, the scanning direction and the measurement direction are the same. FIG. 8 is a partial enlarged view of FIG. 1, like FIG. 3. Referring to FIG. 8, an arrow indicates movement (and the scanning direction in the movement) of a field of view 105 of the alignment detector 13 relative to a wafer 5. In practice, the field of view 105 is fixed and the wafer 5 moves in the direction opposite to that indicated by the arrow together with a wafer stage 6. In the dark-field illumination alignment detector 13, interference fringes formed by light from one mark may mix with those formed by light from another mark when the marks respectively arranged in adjacent scribe line regions S1 and S2 have the same position in the scanning direction. To avoid this, the position, in the scanning direction, of the first mark 104a arranged in the first scribe line region S1 is preferably different from that of the second mark 104b arranged in the second scribe line region S2. In this case, the timing to detect light from the first mark 104a by the sensor of the alignment detector 13 is different from that to detect light from the second mark 104b. The timing for dark-field illumination of the first mark 104a (the second mark 104b is not illuminated at this time) is also different from that for dark-field illumination of the second mark 104b (the first mark 104a is not illuminated at this time).

Figure 9:
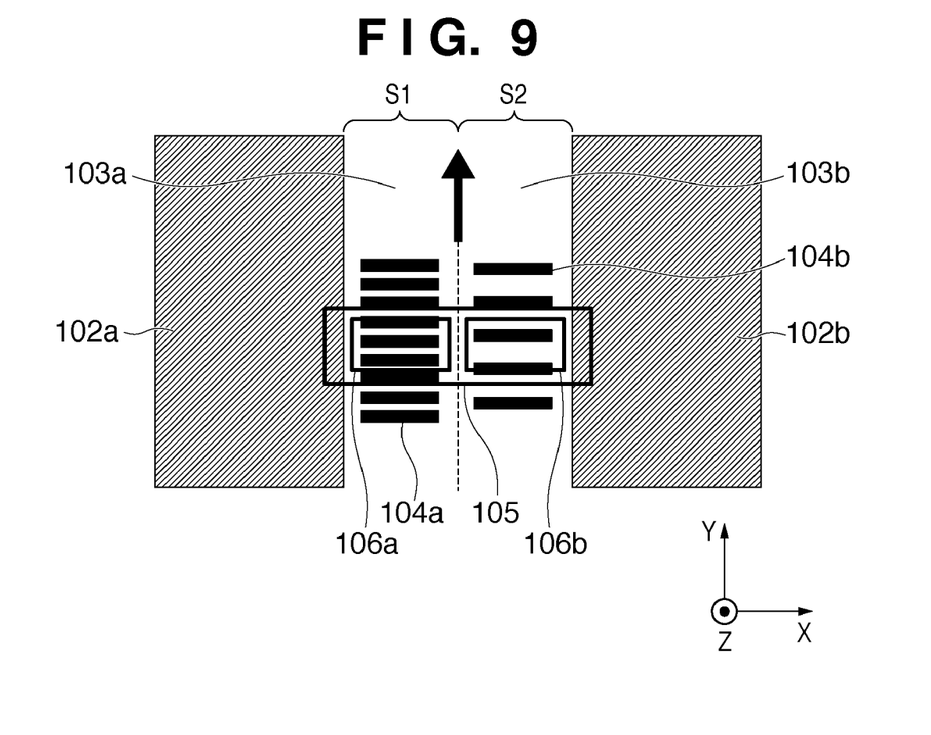
FIG. 9 is a view illustrating alignment marks.
Figure 10A:
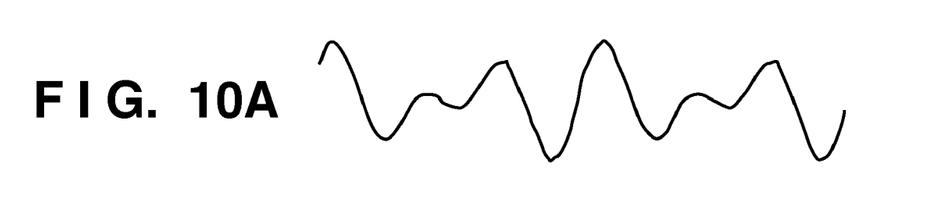
FIGS. 10A to 10C are charts illustrating a signal output from a wafer alignment detector and signals obtained by separating the output signal.
Figure 10B:
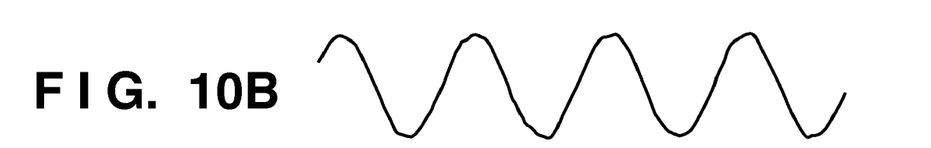
Figure 10C:
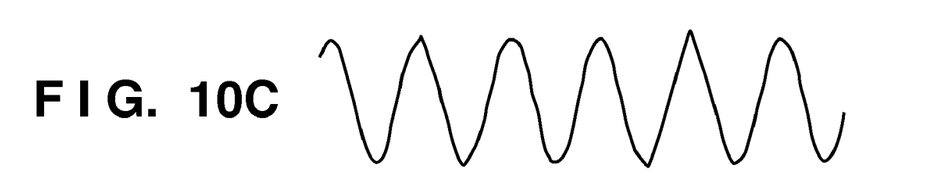

FIG. 9 shows another example of the marks 104a and 104b. In the example shown in FIG. 9, the marks 104a and 104b arranged in the two adjacent scribe line regions S1 and S2, respectively, have the same position in the scanning direction in the dark-field illumination alignment detector 13. However, since the pattern pitches of the marks 104a and 104b are different from each other, the spatial frequencies of two sets of interference fringes respectively formed by them, in turn, are different from each other. Hence, the signals from the two sets of interference fringes can be separated from each other by Fourier-transforming the detection signal output from the alignment detector 13. FIG. 10A illustrates the detection signal output from the sensor of the alignment detector 13. FIGS. 10B and 10C illustrate signals obtained by separating the detection signal shown in FIG. 10A by Fourier transformation. FIG. 10B shows a signal of the mark 104a, and FIG. 10C shows a signal of the mark 104b.

Although a case in which one sensor is used to detect light from each mark has been exemplified above, two sensors which bring respective scribe line regions into main fields of view 106a and 106b may be used. The interval between the two sensors can be, for example, that between the marks on two scribe line regions. Each sensor needs to separate a signal as described above if light beams from the marks in two scribe line regions mix with each other and enter it. Position detection can be performed a plurality of times, while alignment marks move within the fields of view of detectors, by elongating the alignment marks to in the scribe line direction.

Third Embodiment

The third embodiment of the present invention will be described below. In the third embodiment, an alignment detector 13 includes a bright-field illumination detector according to the first embodiment, and a dark-field illumination detector according to the second embodiment. This makes it possible to simultaneously measure the mark position in the scanning direction (scribe line direction) and that in a direction perpendicular to the scanning direction.

Figure 11:
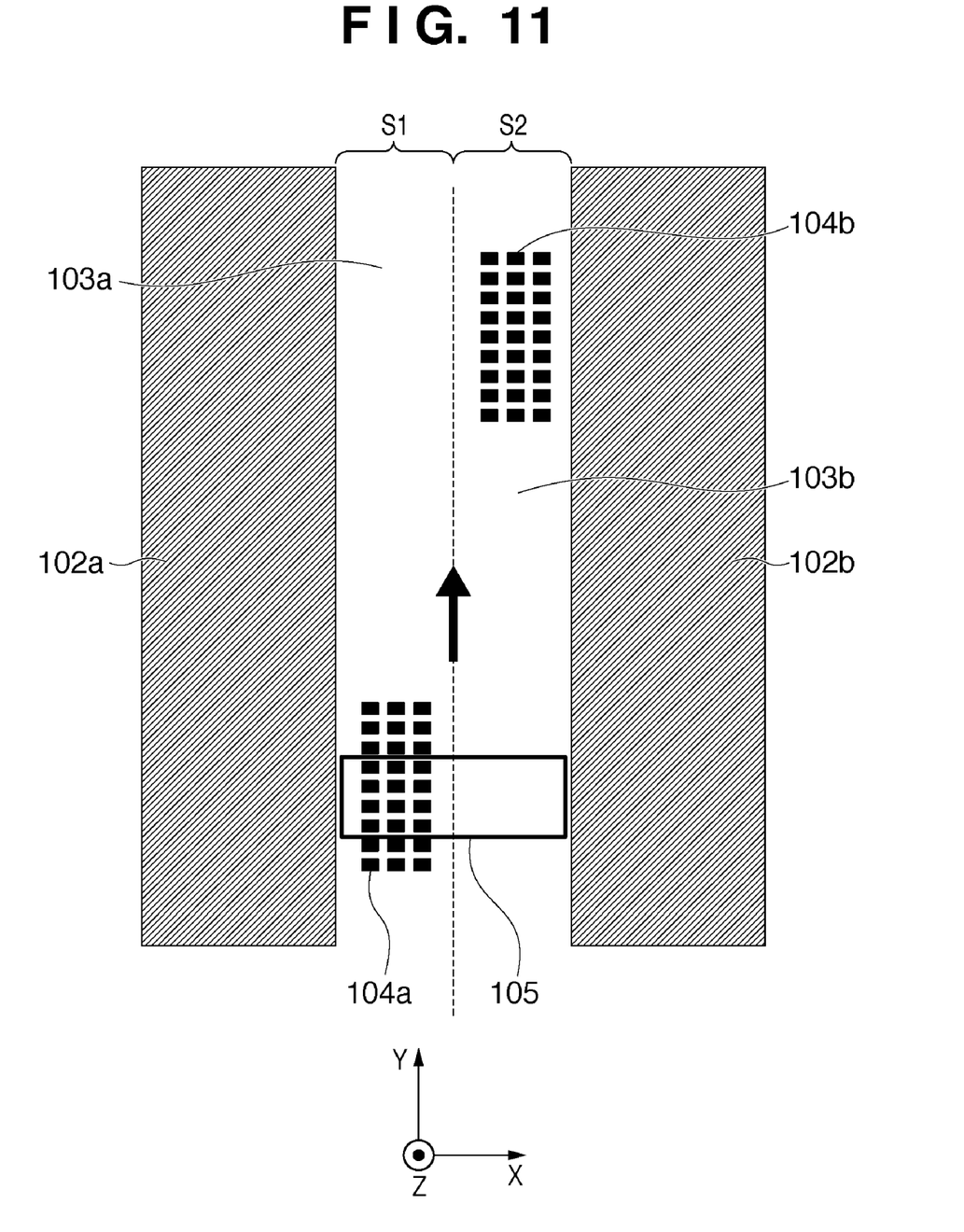
FIG. 11 is a view illustrating alignment marks.

FIG. 11 illustrates wafer alignment marks 104a and 104b suitable for an exposure apparatus according to the third embodiment. FIG. 11 is a partial enlarged view of FIG. 1, like FIG. 3. Referring to FIG. 11, an arrow indicates movement (and the scanning direction in the movement) of a field of view 105 of the alignment detector 13 relative to a wafer 5. In practice, the field of view 105 is fixed and the wafer 5 moves in the direction opposite to that indicated by the arrow together with a wafer stage 6.

The alignment detector 13 according to the third embodiment has the field of view 105 which allows simultaneous observation of two adjacent scribe line regions, as in the first and second embodiments. However, note that the alignment detector 13 according to the third embodiment includes a first detector serving as a bright-field illumination detector according to the first embodiment, and a second detector serving as a dark-field illumination detector according to the second embodiment. The first detector and the second detector may have the same field of view 105 or have different fields of view. For example, light reflected by an alignment mark upon passing through a common objective lens is split by a beam splitter, and the split reflected light beams are received by the sensors of the first detector and second detector.

The marks 104a and 104b shown in FIG. 11 have rectangular or oblong isolated patterns arrayed in the scanning direction (scribe line direction) and in a direction perpendicular to the scanning direction. The first detector can detect the positions of the marks 104a and 104b in a direction perpendicular to the scanning direction, and the second detector can detect the positions of the marks 104a and 104b in the scanning direction.

Although a case in which a first detector and a second detector that have a common field of view are used has been exemplified in this embodiment, the first detector and the second detector may have different fields of view (i.e., objective lenses). In this case, the measurement accuracy can improve because the amount of light received by each detector can increase although the detection positions of the two detectors shift from each other.

[Device Manufacturing Method]

A method of manufacturing a device (e.g., a semiconductor device and a liquid crystal display device) according to one embodiment of the present invention will be explained next. This method can use an exposure apparatus to which the present invention is applied.

A semiconductor device is manufactured by a preprocess of forming an integrated circuit on a wafer (semiconductor substrate), and a post-process of completing, as a product, a chip of the integrated circuit formed on the wafer by the preprocess. The preprocess can include a step of exposing a wafer coated with a photosensitive agent using the above-mentioned exposure apparatus, and a step of developing the wafer exposed in the exposing step. The post-process can include an assembly step (dicing and bonding) and packaging step (encapsulation). Also, a liquid crystal display device is manufactured by a step of forming a transparent electrode. The step of forming a transparent electrode can include a step of coating a glass substrate, on which a transparent conductive film is deposited, with a photosensitive agent, a step of exposing the glass substrate coated with the photosensitive agent using the above-mentioned exposure apparatus, and a step of developing the glass substrate exposed in the exposing step.

The method of manufacturing a device according to this embodiment is more advantageous in at least one of the productivity, quality, and production cost of devices to the prior arts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-098487, filed Apr. 14, 2009, which is hereby incorporated by reference herein in its entirety.

What is claimed is:

1. An exposure apparatus which transfers a pattern of an original to a plurality of shot regions on a substrate, each shot region including a chip region and a scribe line region surrounding the chip region, a first scribe line region of a first shot region and a second scribe line region of a second shot region that is arranged adjacent to the first shot region being arranged between a first chip region of the first shot region and a second chip region of the second shot region, the exposure apparatus comprising:
a detector configured to detect light beams from a first mark in the first scribe line region and a second mark arranged in the second scribe line region by substantially simultaneously observing the first scribe line region and the second scribe line region in a state that the substrate is driven in a measurement scanning direction; and
a processor configured to process detection signals output from the detector to determine positions of the first mark and the second mark,
wherein the substrate is positioned based on the positions of the first mark and the second mark and is exposed.

2. The apparatus according to claim 1, wherein the first mark and the second mark have substantially identical positions in the measurement scanning direction, and the detector substantially simultaneously detects the light beams from the first mark and the second mark.

3. The apparatus according to claim 1, wherein the first mark and the second mark have different positions in the measurement scanning direction, and the detector detects the light beams from the first mark and the second mark at different timings.

4. The apparatus according to claim 1, wherein the detector includes one of an image sensor and a line sensor configured to detect the first mark and the second mark having undergone bright-field illumination.

5. The apparatus according to claim 1, wherein the detector includes a sensor configured to detect interference fringes formed by the light beams reflected by the first mark and the second mark having undergone dark-field illumination.

6. The apparatus according to claim 1, wherein the processor determines positions of the first mark and the second mark in a direction perpendicular to the measurement scanning direction.

7. The apparatus according to claim 1, wherein the processor determines positions of the first mark and the second mark in the measurement scanning direction.

8. The apparatus according to claim 6, wherein
the detection signal, of at least one of the first mark and the second mark, output from the detector has a shape which changes depending on positions of the first mark and the second mark in the measurement scanning direction, and
the processor detects an error of synchronous processing between the driving of the substrate in the measurement scanning direction and the detection operation of the detector, in accordance with the detection signal.

9. An exposure method of transferring a pattern of an original to a plurality of shot regions on a substrate, each shot region including a chip region and a scribe line region surrounding the chip region, a first scribe line region of a first shot region and a second scribe line region of a second shot region that is arranged adjacent to the first shot region being arranged between a first chip region of the first shot region and a second chip region of the second shot region, the method comprising the steps of:
detecting light beams from a first mark in the first scribe line region and a second mark arranged in the second scribe line region by substantially simultaneously observing the first scribe line region and the second scribe line region in a state that the substrate is driven in a measurement scanning direction; and
processing detection signals output in the detecting step to determine positions of the first mark and the second mark,
wherein the substrate is positioned based on the positions of the first mark and the second mark and is exposed.

10. A method of manufacturing a device, in which a pattern of an original is transferred to a plurality of shot regions on a substrate, each shot region including a chip region and a scribe line region surrounding the chip region, a first scribe line region of a first shot region and a second scribe line region of a second shot region that is arranged adjacent to the first shot region being arranged between a first chip region of the first shot region and a second chip region of the second shot region, the method comprising the steps of:
exposing a substrate by detecting light beams from a first mark in the first scribe line region and a second mark arranged in the second scribe line region by substantially simultaneously observing the first scribe line region and the second scribe line region in a state that the substrate is driven in a measurement scanning direction; and processing detection signals output in the detecting step to determine positions of the first mark and the second mark, wherein the substrate is positioned based on the positions of the first mark and the second mark and is exposed; and
developing the substrate.

* * * * *